(12) United States Patent
Miyata

(10) Patent No.: US 10,862,266 B2
(45) Date of Patent: Dec. 8, 2020

(54) LIGHT SOURCE DEVICE

(71) Applicant: NICHIA CORPORATION, Anan (JP)

(72) Inventor: Tadaaki Miyata, Yokohama (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/425,898

(22) Filed: May 29, 2019

(65) Prior Publication Data

US 2019/0372302 A1 Dec. 5, 2019

(30) Foreign Application Priority Data

May 30, 2018 (JP) .................................. 2018-103696

(51) Int. Cl.
*G02B 6/26* (2006.01)
*H01S 5/028* (2006.01)
*G02B 6/42* (2006.01)
*G02B 6/122* (2006.01)
*H01S 5/022* (2006.01)

(52) U.S. Cl.
CPC ............ *H01S 5/028* (2013.01); *G02B 6/1221* (2013.01); *G02B 6/4214* (2013.01); *H01S 5/022* (2013.01)

(58) Field of Classification Search
CPC ........ H01S 5/028; H01S 5/022; H01S 5/0224; H01S 5/4012; H01S 5/021; H01S 5/02292; H01S 5/02248; H01S 5/4093; G02B 6/1221; G02B 6/4214
See application file for complete search history.

(56) References Cited

U.S. PATENT DOCUMENTS

| 5,999,670 | A | 12/1999 | Yoshimura et al. | |
|---|---|---|---|---|
| 6,316,281 | B1 * | 11/2001 | Lee ........................ | G02B 6/136 385/14 |
| 6,477,296 | B1 * | 11/2002 | Ogawa ................. | G02B 6/4246 385/31 |
| 7,373,051 | B2 * | 5/2008 | Ide ..................... | G02B 6/29368 385/47 |

(Continued)

FOREIGN PATENT DOCUMENTS

| GB | 2 353 405 A | 2/2001 |
|---|---|---|
| JP | S63191111 A | 8/1988 |

(Continued)

*Primary Examiner* — Ellen E Kim
(74) *Attorney, Agent, or Firm* — Hunton Andrews Kurth LLP

(57) ABSTRACT

A light source device includes a sub-mount, a semiconductor laser element flip chip mounted on the sub-mount, and a planar lightwave circuit (PLC) which is an optical member having a waveguide disposed on a substrate. The semiconductor laser element and the waveguide are arranged such that a light-emitting point of the semiconductor laser element and a core of the waveguide are substantially aligned. A light-reflecting surface is provided such that light emitted from the semiconductor laser element and propagating along a propagating direction in the planar lightwave circuit is reflected at the light-reflecting surface in a direction substantially normal to the propagating direction. A portion of the substrate of the planar lightwave circuit is removed at least in a predetermined range from an end opposite to a light incident surface of the planar lightwave circuit.

23 Claims, 5 Drawing Sheets

(56) References Cited

U.S. PATENT DOCUMENTS

| | | | | |
|---|---|---|---|---|
| 7,620,091 | B2* | 11/2009 | Heusler | H01S 3/0632 |
| | | | | 372/99 |
| 8,422,836 | B2* | 4/2013 | Riester | G02B 6/4214 |
| | | | | 385/14 |
| 9,008,146 | B2* | 4/2015 | Tamaya | H01S 3/0632 |
| | | | | 372/75 |
| 10,162,134 | B2* | 12/2018 | Kurokawa | G02B 6/4257 |
| 2003/0138198 | A1 | 7/2003 | Plickert et al. | |
| 2004/0057653 | A1* | 3/2004 | Fukuda | G02B 6/124 |
| | | | | 385/14 |
| 2004/0223680 | A1* | 11/2004 | Block | G02B 6/42 |
| | | | | 385/14 |
| 2013/0182994 | A1 | 7/2013 | Castagna et al. | |
| 2017/0075070 | A1* | 3/2017 | Lohse | G02B 6/12004 |

FOREIGN PATENT DOCUMENTS

| | | | |
|---|---|---|---|
| JP | H10300961 | A | 11/1998 |
| JP | 2001021769 | A | 1/2001 |
| JP | 2006201508 | A | 8/2006 |
| JP | 2008216791 | A | 9/2008 |
| JP | 2008262116 | A | 10/2008 |
| JP | 2012198566 | A | 10/2012 |

\* cited by examiner

LIGHT SOURCE DEVICE

CROSS-REFERENCE TO RELATED PATENT APPLICATION

The present application claims priority under 35 U.S.C. § 119 to Japanese Patent Application No. 2018-103696, filed May 30, 2018. The contents of this application are incorporated herein by reference in their entirety.

BACKGROUND OF THE INVENTION

Technical Field

The present disclosure relates to a light source device having a semiconductor laser and a waveguide.

Description of Related Art

Light source devices having a semiconductor laser and a waveguide optically connected to the semiconductor laser have been used in various industrial fields. Among those, there has been proposed an optical-path changing element having an inclined surface which is a part of a V-shaped groove formed in a waveguide provided on a substrate, and is configured to be a light-reflecting surface near a waveguide (for example, see JP H10-300961A). In the optical-path changing element, light propagating in the waveguide can be reflected at the inclined surface, which serves as a light-reflecting surface, in a direction substantially normal to the propagating direction.

SUMMARY

In a light source device having a light source and a waveguide, the light-emitting point of the light source and a location of a core of the waveguide in a height direction are needed to be precisely aligned. In this regard, flip-chip mounting the light source and the waveguide is effective. However, if the optical-path changing element described in JP H10-300961A is flip-chip mounted, the V-shaped groove that forms the light-reflecting surface opens to the substrate side where the optical-path changing element is mounted. With this structure, light reflected at the inclined light-reflecting surface may partially enters the substrate, hindering efficient extraction of light.

The present disclosure is devised in the light of such circumstances, and an object is to provide a light source device in which even when the waveguide and the light-reflecting surface are arranged in close proximity to each other, light reflected at the light-reflecting surface do not enter the substrate, allowing for efficient extraction of light from the light source device.

A light source device according to one embodiment of the present invention includes a sub-mount, a semiconductor laser element mounted on the sub-mount, and a planar lightwave circuit (PLC) which is an optical member having a substrate and a waveguide formed on the substrate, and is flip-chip mounted on the sub-mount. The semiconductor laser element and the waveguide are arranged such that a light-emitting point of the semiconductor laser element and a core of the waveguide are substantially aligned. A light-reflecting surface is provided such that light emitted from the semiconductor laser element and propagating along a propagating direction in the planar lightwave circuit is reflected at the light-reflecting surface in a direction substantially normal to the propagating direction. A portion of the substrate of the planar lightwave circuit is removed at least in a predetermined range from an end opposite side from an incident surface of the planar lightwave circuit.

A light source device according to another embodiment of the present invention includes a sub-mount, a semiconductor laser element disposed on a substrate, and a planar lightwave circuit (PLC) which is an optical member having a waveguide formed on the substrate, the semiconductor laser element being spaced apart from the waveguide of the planar lightwave circuit (PLC). The planar lightwave circuit (PLC) is flip-chip mounted on an upper surface of the sub-mount. The semiconductor laser element is secured on the sub-mount through the planar lightwave circuit and the substrate. A light-emitting point of the semiconductor laser element and a core of the waveguide are substantially aligned. A light-reflecting surface is provided such that light emitted from the semiconductor laser element and propagating along a propagating direction in the planar lightwave circuit is reflected at the light-reflecting surface in a direction substantially normal to the propagating direction. A portion of the substrate of the planar lightwave circuit is removed at least in a predetermined range from an end opposite side from an incident surface of the planar lightwave circuit.

The present disclosure can provide a light source device in which even when the waveguide and the light-reflecting surface are arranged in close proximity to each other, light reflected at the light-reflecting surface do not enter the substrate, allowing for efficient extraction of light from the light source device.

DETAILED DESCRIPTION OF EMBODIMENTS

Figure 1:
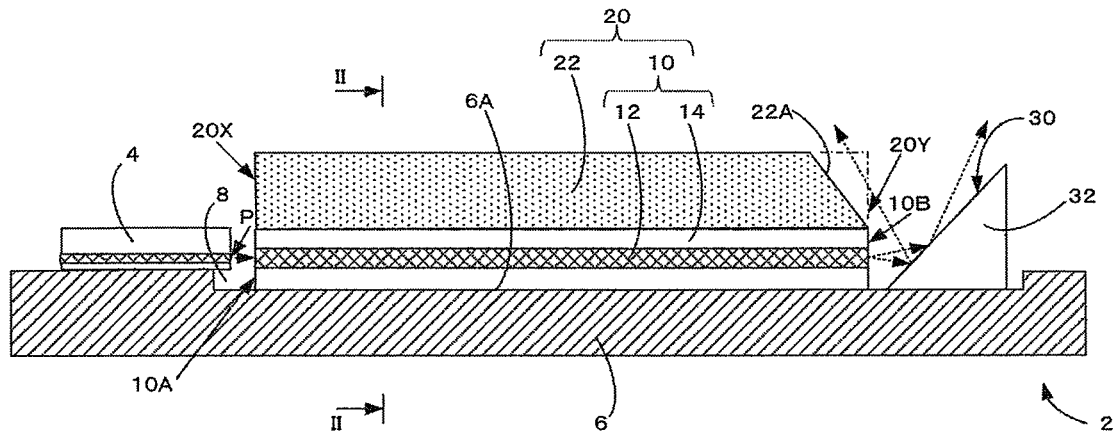
FIG. 1 is a sectional side view schematically showing a structure of a light source device according a first embodiment of the present disclosure.

Certain embodiments and examples of the present invention will be described below with reference to the accompanying drawings. It is to be FIG that the light source device described below is intended for implementing the technical concept of the present invention, and the present invention is not limited to those described below unless otherwise specified.

In the accompanying drawings, the same or similar members are denoted by the same or similar reference numerals or symbols. In consideration of ease of explaining or understanding the main points, embodiments will be shown separately for the sake of convenience, but configurations shown in different embodiments can be partially replaced or combined. In subsequent embodiments and examples, the same or similar description to those already have been provided in preceding embodiments or examples will be appropriately omitted, and the difference will be described below. In particular, like effects obtained by like configurations will not be repeatedly provided for each embodiment or example. In the drawings, the size, positional relationship and the like of the members may be exaggerated for clarity. In the drawings, propagation of light is schematically indicated by dotted arrows.

Light Source Device According to First Embodiment

Figure 2:
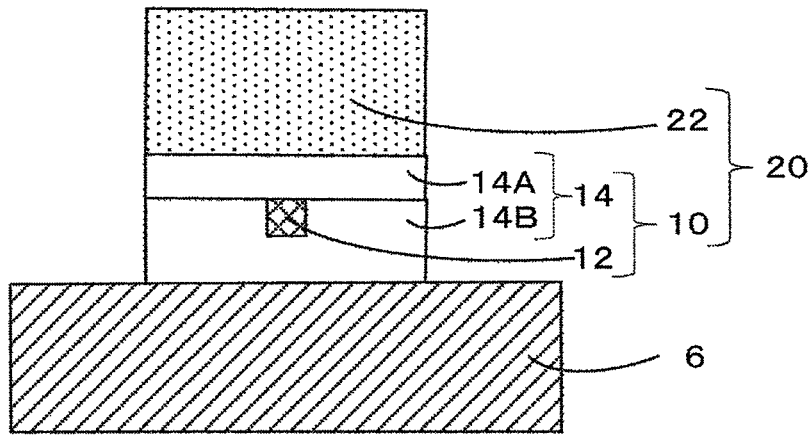
FIG. 2 is a sectional side view taken along line II-II in FIG. 1.

First, with reference to FIG. 1 and FIG. 2, a structure of a light source device according to a first embodiment of the present disclosure will be described. FIG. 1 is a sectional side view schematically showing a structure of a light source device according a first embodiment of the present disclosure. FIG. 2 is a sectional side view taken along line II-II in FIG. 1.

The light source device 2 according to the first embodiment includes a sub-mount 6, a semiconductor laser element 4 flip-chip mounted on an upper surface 6A of the sub-mount 6, and a planar lightwave circuit (PLC) 20 flip-chip mounted on the upper surface 6A of the sub-mount 6. The light source device 2 further includes an upward-reflecting mirror 32 disposed on the upper surface 6A of the sub-mount 6. The upward-reflecting mirror 32 has a light-reflecting surface 30 to reflect light in a direction substantially normal to propagating direction of the light. Accordingly, in the light source device 2 according to the first embodiment, light emitted from the semiconductor laser element 4 and propagates in the planar lightwave circuit 20 is reflected at the upward-reflecting mirror 32 in a direction substantially normal to the upper surface 6A of the sub-mount 6 that corresponds to a base surface.

In the first embodiment, a nitride semiconductor laser element having a lasing wavelength in ultraviolet range or blue wavelength range is used for the semiconductor laser element 4, but another appropriate nitride semiconductor laser element, for example, a nitride semiconductor laser element having a lasing wavelength in green range or a GaAs-based semiconductor laser element having a lasing wavelength in red range or infrared range can also be used.

The planar lightwave circuit 20 is an optical member having a waveguide 10 formed on a substrate 22 such that the position of the light-emitting point P of the semiconductor laser element 4 and the position of the core 12 of the waveguide 10 are substantially aligned. The semiconductor laser element 4 is flip-chip mounted on the sub-mount 6, such that the substrate 22 is located in an upper side in FIG. 1 and FIG. 2 at an opposite side of the sub-mount 6.

In more detail, as shown in FIG. 2, the planar lightwave circuit 20 flip-chip mounted on the sub-mount 6 includes the substrate 22 made of silicon, an under-cladding layer 14A made of $SiO_2$ disposed on the substrate 22, a core 12 made of $SiO_2$ disposed on the under-cladding layer 14A, and further, an over-cladding layer 14B made of $SiO_2$ is disposed on the under-cladding layer 14A and surrounding the core 12. The core 12 has a refractive index greater than that of the cladding layer 14 that includes the under cladding layer 14A and the over cladding layer 14B such that light incident on the core 12 from the light-incident surface 10A of the waveguide 10 is totally reflected at an interface between the core 12 and the cladding layer 14 and allowed to propagate in the core 12.

Examples of the materials of the substrate 22 include silicon and any other appropriate materials used for semiconductor substrate such as gallium arsenide, gallium nitride, aluminum nitride, and sapphire, and a light-transmissive material such as polyimide. When a transparent material is used for the substrate 22, light entering the substrate 22, if any, would be allowed to transmit therethrough as it is, but would attenuate by reflection at the surface of the substrate 22, by absorption in the substrate, and by scattering at the surface and/or inside of the substrate 22.

In addition to $SiO_2$, examples of the materials of the waveguide 10 include polymethyl methacrylate (PMMA), polyimide-based resin (polyimide resin, polyether imide resin, polyether ketone resin, polyester imide resin, or the like), silicone-based resin, polystyrene-based resin, polycarbonate-based resin, polyamide-based resin, polyester-based resin, phenol-based resin, polyquinoline-based resin, polyquinoxaline-based resin, polybenzoxazole-based resin, polybenzoxazole-based resin, and polybenzoimidazole-based resin, of those, particularly, polyimide-based resin that includes fluorine exhibits high light transmissivity and low refractive index is preferable.

The upward-reflecting mirror 32 has a lower surface and an inclined surface substantially at 45 degrees to the lower surface, a light-reflecting film is disposed on the inclined surface to form a light-reflecting surface 30. The light-reflecting surface 30 is configured to reflect light in a direction substantially normal to propagating direction of incident light, and the reflected light is emitted from the light source device 2.

The sub-mount 6 serves as a base to dispose an optical member. The sub-mount 6 may further be disposed on a package substrate or the like, or the sub-mount may serve as a substrate having a predetermined mechanical strength. The materials of the sub-mount 6 can be appropriately selected and examples thereof include silicon, SiC, glass, resin, ceramic, metal, and a composite of those.

Next propagation of light in the light source device 2 according to the first embodiment will be described below. Light emitted from the light-emitting point P of the semiconductor laser element 4 enters the core 12 through the light-incident surface 10A of the waveguide 10, propagates in the core 12 and emitted to the outside from the light-emitting surface 10B of the waveguide 10. Light emitted from the light-emitting surface 10B of the waveguide 10 is reflected at the light-reflecting surface 30 of the upward-reflecting mirror 32 in a direction substantially normal to the upper surface 6A of the sub-mount 6 that serves as the base surface. Thus, realizing the light source device 2 in which light can be extracted in a direction substantially normal to the base surface (i.e., the upper surface 6A of the sub-mount 6).

As schematically shown by dotted arrows in FIG. 1, light reflected at the light-reflecting surface 30 has a predetermined divergence angle. Accordingly, if an end 20Y of the substrate 22 opposite to an end 20X at the light-incident surface side of the planar lightwave circuit 20 also has a vertical surface as that of the light-incident surface 10B of the waveguide 10 the substrate 22 as shown by an imaginary line (alternate long and short dashed line) in FIG. 1, at least a portion of reflected light may be incident on the substrate 22. In such a case, luminous efficiency of the light source device 2 decreases.

In the first embodiment, at the end 20Y of the planar lightwave circuit 20 that is opposite to the end 20X at the light-incident surface side of the planar lightwave circuit 20, the substrate 22 has an inclined surface 22A formed by obliquely removing a portion of the substrate 22, such that light reflected at the light-reflecting surface 30 can be prevented from entering the substrate 22. Accordingly, the light source device 2 of a small size that can emit light in a direction substantially normal to the base surface (i.e., the upper surface 6A of the sub-mount 6) with high light-emitting efficiency can be realized.

For example, the inclined surface 22A of the substrate 22 according to the first embodiment may be formed with a crystal plane of silicon. Accordingly, the inclined surfaces with a precise inclination angle can be formed by etching silicon. The inclined surface 22A that is a crystal plane has an inclination angle of, for example, 54.7 degrees, but another appropriate inclination angle may be employed.

When the semiconductor laser element 4 and the planar lightwave circuit 20 are flip-chip mounted without using any additional member on a single surface (for example, the upper surface 6A of the sub-mount 6), generally, the core 12 of the waveguide 10 of the planar lightwave circuit 20 locates higher than the light-emitting point P of the semiconductor laser element 4. In the first embodiment, as shown in FIG. 1, in order to align the height of the light-emitting point P of the semiconductor laser element 4 with the height of the core 12 of the waveguide 10 of the planar lightwave circuit 20, a recess 8 is formed in the upper surface 6A of the sub-mount 6 in a region on which the planar lightwave circuit 20 to be mounted.

Accordingly, the height of the light-emitting point P of the semiconductor laser element 4 and the height of the core 12 of the waveguide 10 of the planar lightwave circuit 20 can be aligned.

Figure 3:
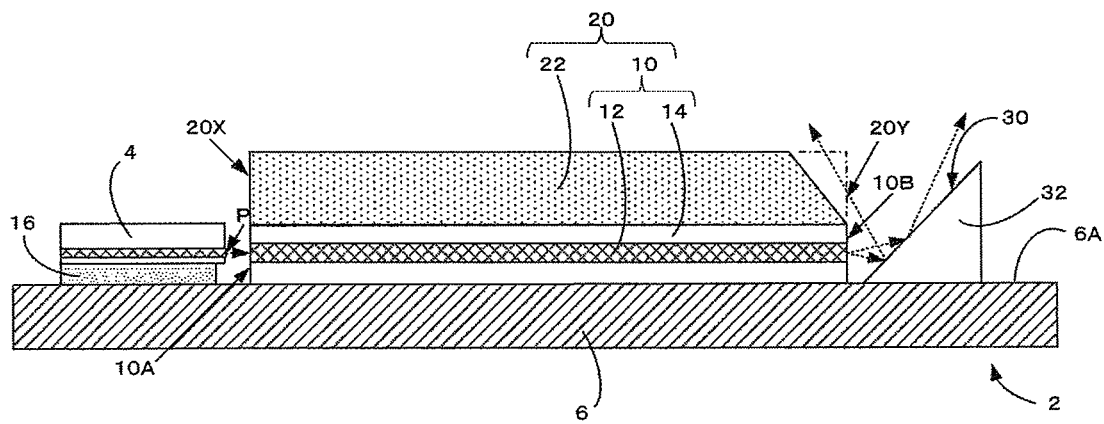
FIG. 3 is a sectional side view schematically showing another configuration for aligning the height of the light-emitting point and the height of the core, in the light source device according to the first embodiment of the present disclosure.

Another Configuration for Aligning Height of Light-Emitting Point and Height of Core Next, with reference to FIG. 3, another configuration for aligning the height of the light-emitting point P of the semiconductor laser element 4 and the height of the core 12 of the waveguide 10 of the planar lightwave circuit 20 will be described. FIG. 3 is a sectional side view schematically showing another configuration for aligning the height of the light-emitting point P and the height of the core 12, in the light source device 2 according to the first embodiment.

In the configuration shown in FIG. 3, the sub-mount 6 is not formed with the recess and has a flat upper surface 6A. Further, in order to align the height of the light-emitting point P of the semiconductor laser element 4 and the height of the core 12 of the planar lightwave circuit 10 of the planar lightwave circuit 20, a spacer 16 is provided between the sub-mount 6 and the semiconductor laser element 4.

Accordingly, the height of the light-emitting point P of the semiconductor laser element 4 and the height of the core 12 of the waveguide 10 of the planar lightwave circuit 20 can be aligned reliably.

Figure 4A:
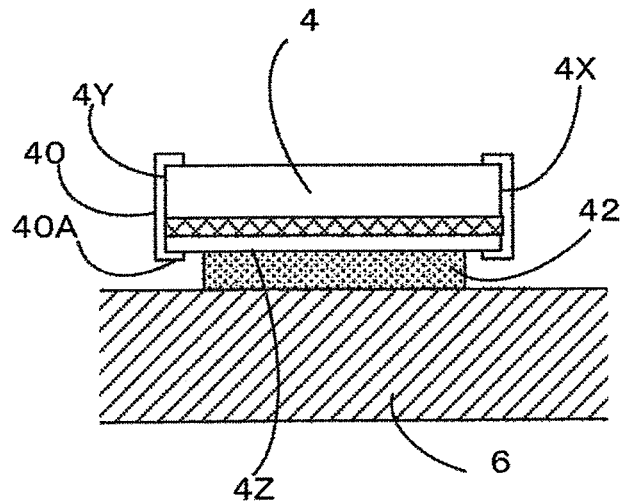
FIG. 4A is a sectional side view schematically showing one example of bonding a semiconductor laser element to a sub-mount side by using a bonding member.

Configuration for Bonding Semiconductor Laser Element to Sub-Mount Side Using Bonding Member Next, with reference to FIG. 4A, an example of configuration in which the semiconductor laser element is bonded to a sub-mount side by using a bonding member. FIG. 4A is a sectional side view schematically showing one example of bonding the semiconductor laser element to the sub-mount side by using a bonding member.

The semiconductor light laser element 4 is bonded to the sub-mount 6 side through a bonding member 42. Examples of the bonding member 42 include AuSn, Au, Ag, Cu, solder, and metal nanomaterials.

A coating 40 made of a dielectric film that serves as an antireflection film is disposed on the light-emitting surface 4X and its opposite end 4Y of the semiconductor laser element 4 The coating 40 is needed to be applied on the entire surfaces of the light-emitting surface 4X and the end surface 4Y at the opposite side, which may create wraparound portions 40A of the coating 40 extending beyond in a predetermined range of the lower surface 4Z of the semiconductor laser element 4. The predetermined range may be, for example, about 5 to 50 μm from each end of the lower surface 4Z.

If the bonding member 42 has dimensions aligning to the ends of the lower surface 4Z of the semiconductor laser element 4 and solid phase bonding is employed, portions of the bonding member 42 are brought in contact with the wraparound portions 40A of the coating 40, which may result in a defect or a failure in the bonding between the bonding member 42 and the lower surface 4Z of the semiconductor laser element 4. Further, the height of the light-emitting point P of the semiconductor laser element 4 and the height of the core 12 of the waveguide 10 of the planar lightwave circuit 20 may become difficult to be aligned.

Also when liquid phase bonding is employed, bonding cannot be established at the wraparound portions 40A of the coating 40, which may result in a defect or a failure in the bonding between the bonding member 42 and the lower surface 4Z of the semiconductor laser element 4.

In the first embodiment, the bonding member 42 used for bonding the semiconductor laser element 4 to the sub-mount 6 side is not provided in predetermined regions from the light-emitting side end and from the opposite side end with respect to the light-emitting side of the lower surface 4Z of the semiconductor laser element 4. The predetermined regions need to be larger than the wraparound portions 40A of the coating 40, such that the predetermined regions may be, for example, in a range of 10 to 100 μm from corresponding end of the lower surface 4Z of the semiconductor laser element 4, according to the size of the wraparound portions 40A of the coating 40.

In the first embodiment, the bonding member 42 is not provided in the predetermined regions from the light-emitting side end and from the end opposite side of the light-emitting side of the lower surface 4Z of the semiconductor laser element 4, such that the semiconductor laser element 4 can be reliably bonded to the sub-mount 6 side and the height of the light-emitting point P of the semiconductor laser element 4 can be reliably aligned to the height of the core 12 of the waveguide 10 of the planar lightwave circuit 20.

The configuration described above can be effective not only when using a solid phase bonding but also when using a bonding member that is molted with applying pressure, or when using a semi-molted bonding member.

Figure 4B:
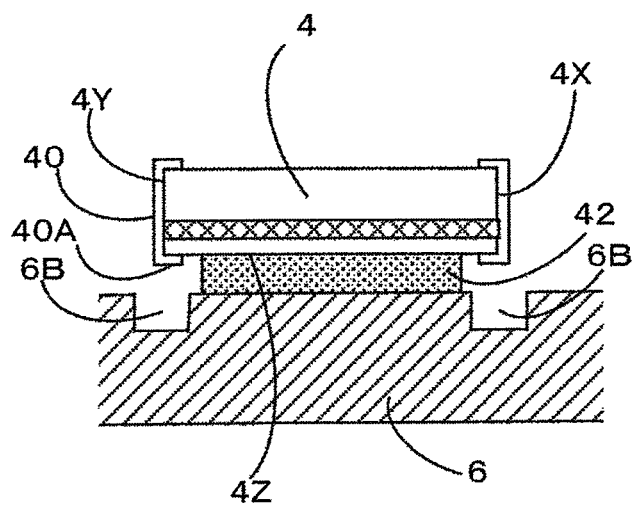
FIG. 4B is a sectional side view schematically showing another example disclosure of bonding a semiconductor laser element to a sub-mount side by using a bonding member.
Figure 4C:
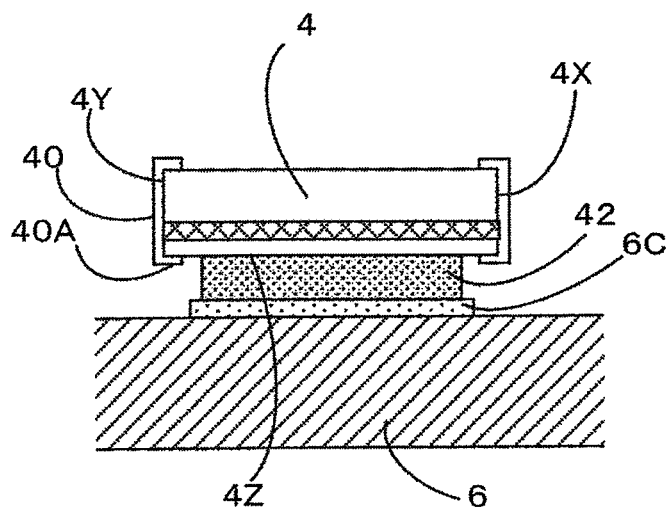
FIG. 4C is a sectional side view schematically showing another example disclosure of bonding a semiconductor laser element to a sub-mount side by using a bonding member.

In addition to the example shown in FIG. 4A, examples of the configuration in which the bonding member 42 is not provided in the predetermined regions from the light-emitting side end and from the end opposite side of the light-emitting side of the lower surface 4Z of the semiconductor laser element 4 include the examples shown in FIG. 4B and FIG. 4C. FIG. 4B and FIG. 4C are respectively a sectional side view schematically showing another example of bonding a semiconductor laser element to a sub-mount side by using a bonding member.

In the example shown in FIG. 4B, recesses 6B are formed in the sub-mount 6, in each of the regions of the lower surface 4Z of the semiconductor laser element 4, where the bonding member 42 is not disposed. An excessive amount of bonding member can be accommodated in the recesses 6B, such that the semiconductor laser element 4 can be bonded to the sub-mount 6 side without creating mechanical interference.

In the example shown in FIG. 4C, a plating 6C is applied on the sub-mount 6 in a region to be in contact with the bonding member 42. With the plating 6, the installation height of the semiconductor laser element 4 can be increased, such that the semiconductor laser element 4 can be bonded to the sub-mount 6 side without creating mechanical interference.

Figure 5:
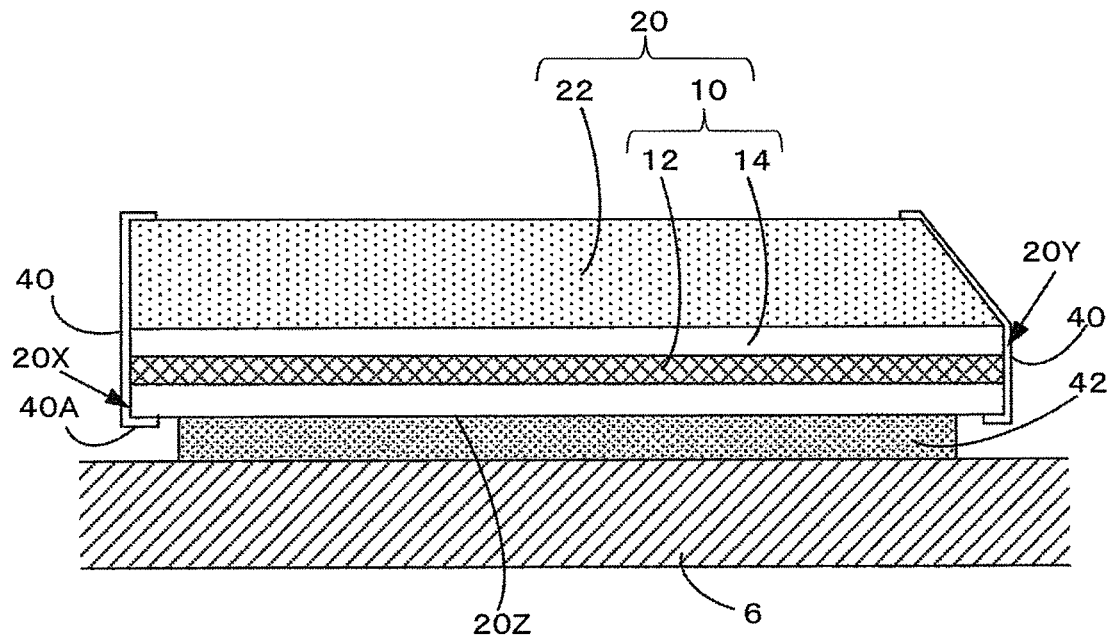
FIG. 5 is a sectional side view schematically showing one example of bonding a planar lightwave circuit to a sub-mount side by using a bonding member.

Configuration for Bonding Planar Lightwave Circuit to Sub-Mount Side Using Bonding Member Next, with reference to FIG. 5, an example of configuration in which a planar lightwave circuit is bonded to a sub-mount side by using a bonding member will be described. FIG. 5 is a sectional side view schematically showing one example of bonding a planar lightwave circuit to a sub-mount side by using a bonding member.

The configuration of the planar lightwave circuit 20 is almost similar to that used with the semiconductor laser element 4 described above. The planar lightwave circuit 20 is bonded to the sub-mount 6 side through a bonding member 42. A coating 40 made of a dielectric film that serves as an antireflection film is disposed on the end 20X at the light-incident surface side and its opposite end 20Y (end at light-emitting surface side) of the planar lightwave circuit 20. The coating 40 has wraparound portions 40A extending onto a lower surface 20Z of the planar lightwave circuit 20, in a predetermined range, for example, in a range of about 5 to 50 μm from an end of the lower surface of the planar lightwave circuit 20.

In the first embodiment, the bonding member 42 used for bonding a planar lightwave circuit 20 to the sub-mount 6 side is not provided in predetermined regions from the light-incident side end and from the end opposite side of the light-emitting side of the lower surface 20Z of the planar lightwave circuit 20. The predetermined region is greater than the wraparound portions of the coating 40, for example, in a range of 10 to 100 μm from corresponding end of the lower surface of the planar lightwave circuit 20, according to the size of the wraparound portions 40A of the coating 40.

Also in the first embodiment, the bonding member 42 is not provided in the predetermined regions from the light-incident side end and from the end opposite side of the light-incident side of the lower surface 20Z of the planar lightwave circuit 20, such that the planar lightwave circuit 20 can be reliably bonded to the sub-mount 6 side and the height of the core 12 of the waveguide 10 of the planar lightwave circuit 20 can be reliably aligned to the height of the light-emitting point P of the semiconductor laser element 4.

The configuration described above can be effective not only when using a solid phase bonding but also when using a bonding member that is molted with applying pressure, or when using a semi-molted bonding member.

Light Source Device Having a Plurality of Semiconductor Laser Elements

Figure 6:
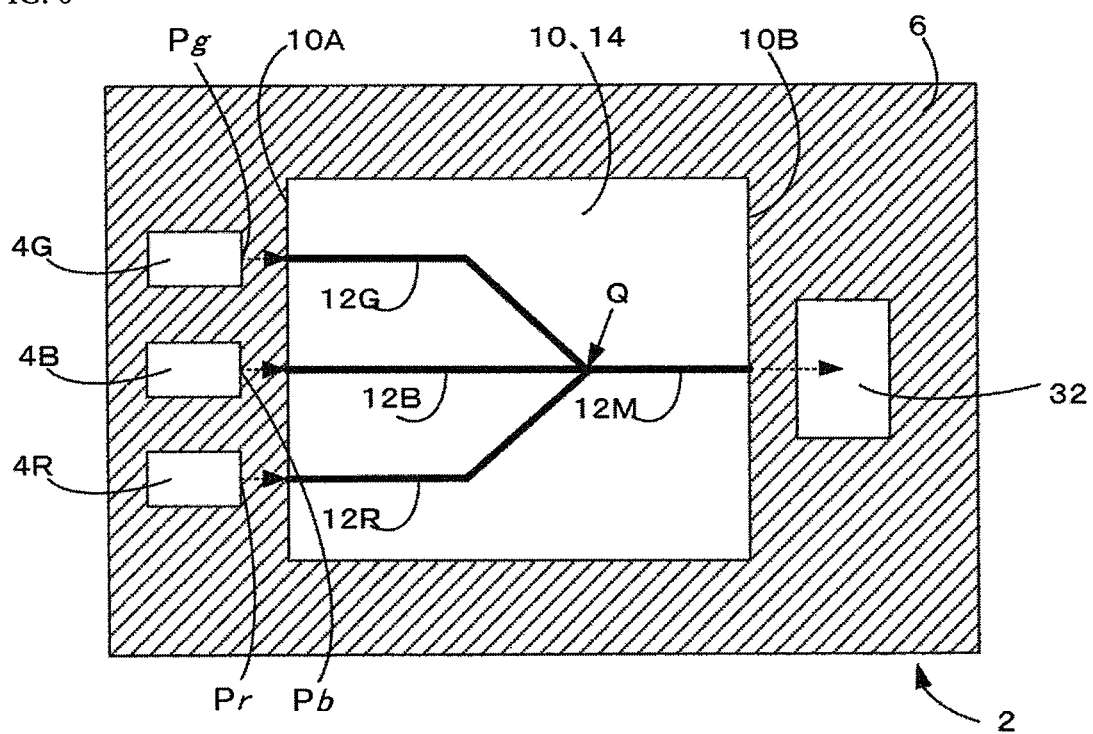
FIG. 6 is a plan view schematically showing a light source device having a plurality of semiconductor laser elements of different wavelength ranges, and a planar lightwave circuit having cores each corresponding to a wavelength of a respective one of the plurality of semiconductor laser elements, and a core adapted for a combined wavelengths.

Next, with referring to FIG. 6, a light source device having plurality of semiconductor laser elements will be described. FIG. 6 is a plan view schematically showing a light source device having a plurality of semiconductor laser elements of different wavelength ranges, and a planar lightwave circuit having cores each corresponding to a wavelength of a respective one of the plurality of semiconductor laser elements, and a core adapted for a combined the respective wavelengths.

The light source device 2 according to the first embodiment includes a green light-emitting semiconductor laser element 4G configured to emit light in green-light range, a blue light-emitting semiconductor laser element 4B configured to emit light in blue-light range, and a red light-emitting semiconductor laser element 4R configured to emit light in red-light range. The planar lightwave circuit 20 includes cores 12G, 12B and 12R each corresponding to a respective one of the wavelengths of the semiconductor laser elements.

In more detail, the planar lightwave circuit 20 includes a core 12G for green light corresponding to green light-emitting semiconductor laser element 4G, a core 12B for blue light corresponding to blue light-emitting semiconductor laser element 4B, and a core 12R for red light corresponding to red light-emitting semiconductor laser element 4R. As shown in FIG. 6, in a plan view, the locations of the light-emitting points Pg, Pb, and Pr of the semiconductor laser elements 4G, 4B, and 4R and the locations of the cores 12G, 12B, and 12R of the waveguide 10 are arranged to be substantially aligned with each other, respectively. The cores 12G, 12B, and 12R extending from the light-incident surface 10A toward the light-emitting side of the waveguide 10 are combined at a junction Q and a core 12M configured to transmit the combined light is extended to the light-emitting surface 10B of the waveguide 10.

As described above, the light source device according to the first embodiment includes a plurality of semiconductor laser elements 4G, 4B, and 4R, respectively configured to emit light in the green light region, a blue light region, and a red light region, and the planar lightwave circuit 20 that includes the waveguide 10 having cores 12G, 12B, and 12R, respectively corresponds to the wavelengths of the semiconductor laser elements 4G, 4B, and 4R and the core M to transmit the combined light. Thus, light of wavelengths can be combined through the planar lightwave circuit 20. With the configuration described above, the light source device 2 of a small size that can emit light of desired color, for example, white light with high light-emitting efficiency can be provided.

Light Source Device According to Second Embodiment

Figure 7A:
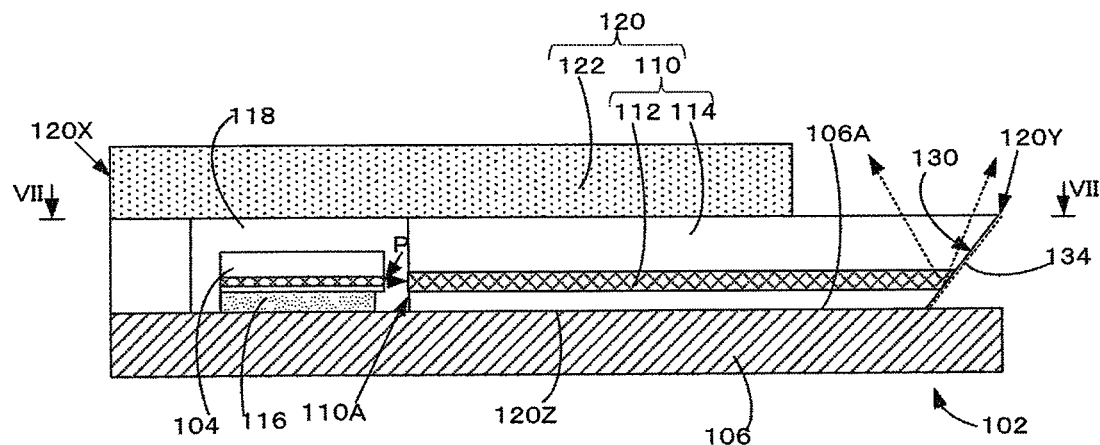
FIG. 7A is a sectional side view schematically showing a structure of a light source device according a second embodiment of the present disclosure.
Figure 7B:
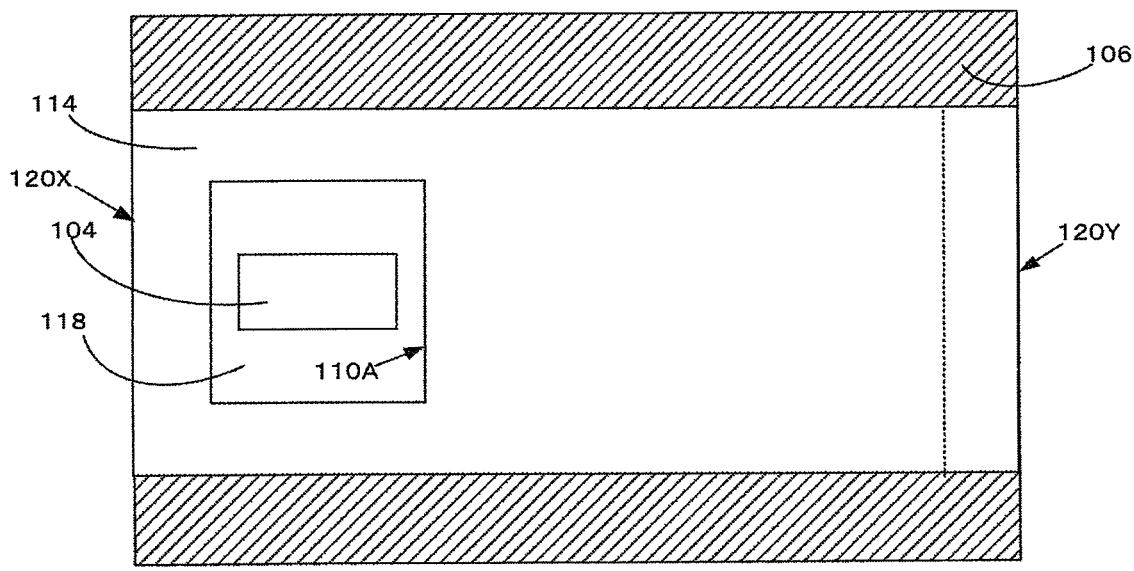
FIG. 7B is a sectional plan view taken along line II-II in FIG. 7A.

Next, with reference to FIG. 7A and FIG. 7B, the configuration of the light source device according to a second embodiment of the present disclosure will be described. FIG. 7A is a sectional side view schematically showing a structure of a light source device according to the second embodiment of the present disclosure. FIG. 7B is a sectional plan view taken along line VII-VII in FIG. 7A.

Similar to the light source device 2 according to the first embodiment as described above, the light source device 102 according to the second embodiment also includes a sub-mount 106, a semiconductor laser element 104 flip-chip mounted on an upper surface 106A of the sub-mount 106, and a planar lightwave circuit 120 flip-chip mounted on the upper surface 106A of the sub-mount 106. In the light source device 102 according to the second embodiment, an upward-reflecting mirror is not provided, but instead of the upward-reflecting mirror, at a light-emitting end of the planar lightwave circuit 120, a portion of a waveguide 110 having a core 112 and a cladding layer 114 has an inclined surface inclined with respect to a propagating direction of light. A light-reflecting film 134 is disposed on the inclined surface to form a light-reflecting surface 130.

The inclined surface is inclined at substantially 45 degrees with respect to a lower surface 120Z of the planar lightwave circuit 120, and light propagate in the waveguide 110 is reflected at the inclined light-reflecting surface 130 in a direction substantially normal to its propagating direction.

The waveguide 110 is formed with a recess 118 and the semiconductor laser element 104 is disposed in a space formed by the recess 118. Thus, the semiconductor laser element 104 flip-chip mounted on the upper surface 106A of the sub-mount 106 is disposed in a closed space surrounded by the sub-mount 106, the waveguide 110, and the substrate 122, such that the semiconductor laser element 104 is not affected by the ambient air.

In the second embodiment, the sub-mount 106 is not formed with the recess and has a flat upper surface 106A. Further, in order to align the height of the light-emitting point P of the semiconductor laser element 104 and the height of the core 112 of the planar lightwave circuit 110 of the planar lightwave circuit 120, a spacer 116 is provided between the sub-mount 106 and the semiconductor laser element 104. In order to align the height of the light-emitting point P and the height of the core 112, other appropriate configuration can also be employed, for example, a recess may be formed in the upper surface 106A of the sub-mount 106.

Next, propagation of light in the light source device 2 according to the second embodiment will be described. Light emitted from the light-emitting point P of the semiconductor laser element 104 enters the core 112 from the light-incident surface 110A of the waveguide 110, and propagates in the core 112, and reaches the light-reflecting surface 130 at the opposite side of the waveguide 110. The light propagates in the core 112 is reflected at the light-reflecting surface 130, in a direction substantially normal to the propagating direction, that is, in a direction substantially normal to the upper surface 106A of the sub-mount 106, that corresponds to the base surface. That is, the inclined surface having the light-reflecting film 134 can serve similar to the upward-reflecting mirror.

As shown by the dotted arrows in FIG. 7A, light reflected at the light-reflecting surface 130 has a predetermined divergence angle. For this reason, if the substrate 122 is provided at the opposite end 120Y from the end 120X at the semiconductor laser element side of the planar lightwave circuit 120, there is a possibility of light reflected at the light-reflecting surface 130 entering the substrate 122. In such a case, light-emitting efficiency of the light source device 2 decreases.

In the light source device 102 according to the second embodiment, a predetermined portion of the substrate 122 corresponding to degree of divergence of the light reflected at the light-reflecting surface 130 is removed. Accordingly, light reflected at the light-reflecting surface 130 can be reliably prevented from entering the substrate 122.

The predetermined range can be appropriately determined according to the divergence angle of the reflected light. Further, not only a portion of the substrate 122 corresponding to a predetermined distance from the end 120Y opposite side of the end X at the semiconductor laser element side of the planar lightwave circuit 120 may be removed, but also all the substrate 122 may be removed. This can be realized, for example, by applying etching to remove the substrate 122 for a longer period of time. In other case, as in the first embodiment, a portion of the substrate 122 may be obliquely removed.

Other structure of the light source device is similar to that of the light source device according to the first embodiment described above, so that detailed description thereof will be omitted.

Figure 8:
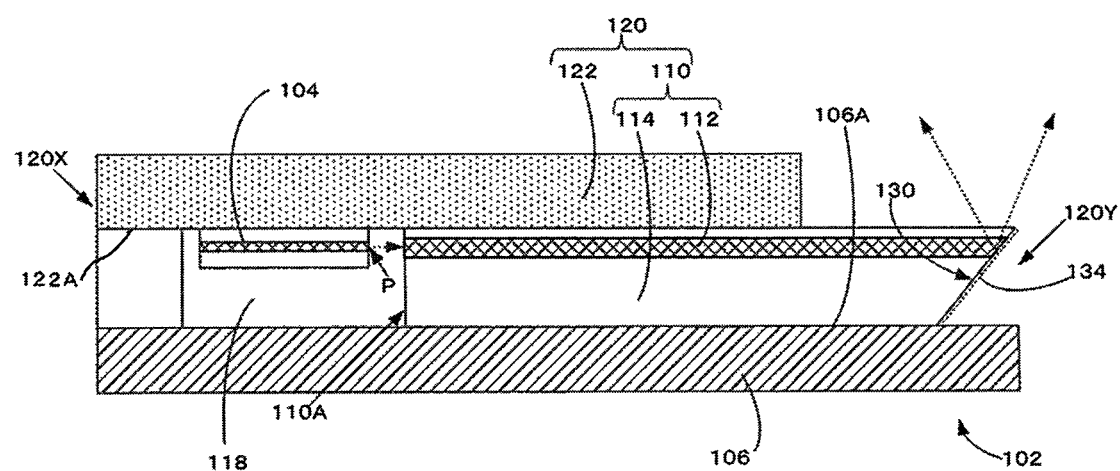
FIG. 8 is a sectional side view schematically showing another arrangement of the light source device and the planar lightwave circuit according to the second embodiment of the present disclosure.

Other Configuration in Arrangement of Semiconductor Laser Element and Planar Lightwave Circuit Next, with referring to FIG. 8, other configuration in arrangement of the semiconductor laser element and the light source device will be described. FIG. 8 is a sectional side view schematically showing another arrangement of the semiconductor laser element and the planar lightwave circuit in the light source device according to the second embodiment of the present disclosure.

In another configuration, the semiconductor laser element 104 and the waveguide 110 are disposed on a single substrate 122. That is, the semiconductor laser element 104 may be mounted on the substrate 122 of the planar lightwave circuit 120, and aligned with the waveguide 110. Accordingly, the distance between the upper surface 122A of the substrate 122 and the light-emitting point P of the semiconductor laser element 104 and the distance between the upper surface 122A of the substrate 122 and the core 112 of the waveguide 110 can be made in high accuracy. Accordingly, the height of the light-emitting point P of the semiconductor laser element 104 and the height of the core 112 of the waveguide 110 of the planar lightwave circuit 120 can be reliably aligned.

The planar lightwave circuit 120 is flip-chip mounted on the upper surface 106A of the sub-mount 106, and the semiconductor laser element 104 is disposed on the substrate 122 sharing with the planar lightwave circuit 120. The semiconductor light emitting element 104 is secured on a sub-mount 106 with a bonding surface in an upper side in the figure. That is, the semiconductor laser element 104 is secured to the sub-mount 106 through the planar lightwave circuit 120 and the substrate 122.

Note that, in FIG. 8, the light-reflecting surface 130 is formed at the light-emitting end of the planar lightwave circuit 120, with the inclined surface inclined with respect to the propagating direction of light, but other appropriate configuration can also be employed. For example, as shown in FIG. 1, the light-reflecting surface is not provided at the light-emitting end of the planar lightwave circuit 120 and an upward-reflecting mirror may be separately provided to reflect light from the planar lightwave circuit 120.

General

The light source device 2 according to certain embodiments and examples described above includes a sub-mount 6 (106), a semiconductor laser element 4 (104) configured to emit light from a light-emitting point P and being mounted on the sub-mount 6 (106), a planar lightwave circuit 20 which is an optical member and flip-chip mounted on an upper surface 6A (106A) of the sub-mount 6 (106), and includes a substrate 22 (122) and a waveguide 10(110) disposed on the substrate 22 (122). The light-emitting point P of the semiconductor laser element 4 (104) and the core 12 (112) of the waveguide 10 (110) are substantially aligned in height. The light-reflecting surface 30 (130) is configured such that light emitted from the semiconductor laser element 4 (104) and propagates in a propagating direction in the planar lightwave circuit 20 (120) is reflected at the light-reflecting surface 30 (130) in a direction substantially normal to the propagating direction. A portion of the substrate 22 (122) is removed at least in a predetermined range from an end 20Y (120Y) opposite side from an end 20X (120X) at an incident surface (the semiconductor laser element 4 (104) side) of the planar lightwave circuit 20 (120).

The semiconductor laser element 4 (104) and the planar lightwave circuit 20 (120) are flip-chip mounted on an upper surface 6A (106A) of the sub-mount 6 (106), or disposed on a single substrate, such that the location of the light emitting point P can be reliably aligned to the location of the core 12 (112). Further, a portion of the silicon substrate 22 (122) is removed from a predetermined range at least at an end 20Y (120Y) at opposite side of the end 20X (120X) at the light-incident side (the semiconductor laser element side) of the planar lightwave circuit 20 (120), such that even when the light-reflecting surface 30 (130) and the planar lightwave circuit 20 (120) are disposed close to each other, light reflected at the light-reflecting surface 30 (130) can be prevented from entering the silicon substrate 22 (122).

As described above, the present disclosure can provide a light source device 2 of a small size that can emit light in a direction substantially normal to the base surface (i.e., the upper surface 6A (106A) of the sub-mount 6 (106)) with high light emitting efficiency.

While the present invention has been described according to the embodiments and the aspects with a certain degree of details, contents of disclosure of the embodiments and aspects shall be varied in details of the configuration, and the combination of elements and the change of order in the embodiments and aspects can be realized without deviating from the scope of the claims and contents of the present invention.

What is claimed is:

1. A light source device comprising:
   a sub-mount;
   a semiconductor laser element flip chip mounted on the sub-mount; and
   a planar lightwave circuit (PLC) which is an optical member having a substrate and a waveguide formed on the substrate, and is flip-chip mounted on the sub-mount;
   wherein
   the semiconductor laser element and the waveguide are arranged such that a light-emitting point of the semiconductor laser element and a core of the waveguide are substantially aligned,
   a light-reflecting surface is provided such that light emitted from the semiconductor laser element and propagating along a propagating direction in the planar lightwave circuit is reflected at the light-reflecting surface in a direction substantially normal to the propagating direction and toward a side where the substrate is disposed, and
   a portion of the substrate of the planar lightwave circuit is removed at least in a predetermined range from a light-emitting side end of the planar lightwave circuit opposite to a light incident surface of the planar lightwave circuit.

2. The light source device according to claim 1, comprising an upward-reflecting mirror configured to serve as the light-reflecting surface and disposed at a light-emitting side of the planar lightwave circuit, wherein the substrate of the planar lightwave circuit has an inclined surface at the light-emitting side end of the planar lightwave circuit.

3. The light source device according to claim 2, wherein the substrate is a silicon substrate and the inclined surface is a crystal plane.

4. The light source device according to claim 1, wherein at the light-emitting side end of the planar lightwave circuit, a portion of the waveguide has an inclined surface with respect to the propagating direction of light, a light-reflecting film is disposed on the inclined surface to form the light-reflecting surface, and a portion of the substrate of the planar lightwave circuit is removed in the predetermined range corresponding to a spread angle of light reflected at the light-reflecting surface.

5. The light source device according to claim 1, wherein a recess is formed in an upper surface of the sub-mount in a region where the planar lightwave circuit is disposed, such that a height of the light-emitting point of the semiconductor laser element and a height of the core of the waveguide of the planar lightwave circuit are aligned.

6. The light source device according to claim 1, wherein a spacer member is disposed between the sub-mount and the semiconductor laser element such that a height of the light-emitting point of the semiconductor laser element and a height of the core of the waveguide of the planar lightwave circuit are aligned.

7. The light source device according to claim 1, wherein a bonding member bonding the semiconductor laser element to the sub-mount is disposed except for predetermined regions at the light-emitting side end and opposite side end with respect to a lower surface of the semiconductor laser element.

8. The light source device according to claim 1, wherein a bonding member bonding the planar lightwave circuit and the sub-mount is disposed except for predetermined regions at the light-incident side end and opposite side end with respect to a lower surface of the planar lightwave circuit.

9. A light source device comprising:
   a sub-mount;
   a semiconductor laser element disposed on a substrate, and a planar lightwave circuit (PLC) which is an optical member having a waveguide formed on the substrate, the semiconductor laser element being spaced apart from the waveguide of the planar lightwave circuit (PLC); wherein
   the planar lightwave circuit is flip-chip mounted on an upper surface of the sub-mount,
   the semiconductor laser element is secured on the sub-mount through the planar lightwave circuit and the substrate,
   a light-emitting point of the semiconductor laser element and a core of the waveguide are substantially aligned,
   a light-reflecting surface is provided such that light emitted from the semiconductor laser element and propagating along a propagating direction in the planar lightwave circuit is reflected at the light-reflecting surface in a direction substantially normal to the propagating direction, and a portion of the substrate of the planar lightwave circuit is removed at least in a predetermined range from an end opposite side from an incident surface of the planar lightwave circuit.

10. A light source device comprising:
a sub-mount;
a semiconductor laser element flip chip mounted on the sub-mount; and
a planar lightwave circuit (PLC) which is an optical member having a substrate and a waveguide formed on the substrate, and is flip-chip mounted on the sub-mount; wherein
the semiconductor laser element and the waveguide are arranged such that a light-emitting point of the semiconductor laser element and a core of the waveguide are substantially aligned,
a light-reflecting surface is provided such that light emitted from the semiconductor laser element and propagating along a propagating direction in the planar lightwave circuit is reflected at the light-reflecting surface in a direction substantially normal to the propagating direction, and
a portion of the substrate of the planar lightwave circuit is removed at least in a predetermined range from a light-emitting side end of the planar lightwave circuit opposite to a light incident surface of the planar lightwave circuit,
wherein the light source devices comprises a plurality of semiconductor laser elements each respectively configured to emit light in a red range, a blue range and a green range,
a plurality of cores each corresponding to respective one of the plurality of semiconductor laser elements; and
wherein light emitted from the plurality of semiconductor laser elements is combined in the planar lightwave circuit.

11. A light source device comprising:
a sub-mount;
a semiconductor laser element flip chip mounted on the sub-mount; and
a planar lightwave circuit (PLC) which is an optical member having a substrate and a waveguide formed on the substrate, and is flip-chip mounted on the sub-mount;
wherein
the semiconductor laser element and the waveguide are arranged such that a light-emitting point of the semiconductor laser element and a core of the waveguide are substantially aligned,
a light-reflecting surface is provided such that light emitted from the semiconductor laser element and propagating along a propagating direction in the planar lightwave circuit is reflected at the light-reflecting surface in a direction substantially normal to the propagating direction and toward a side where the substrate is disposed, and
the substrate of the planar lightwave circuit is not present at least in a predetermined range from a light-emitting side end of the planar lightwave circuit opposite to a light incident surface of the planar lightwave circuit.

12. The light source device according to claim 11, comprising an upward-reflecting mirror configured to serve as the light-reflecting surface and disposed at a light-emitting side of the planar lightwave circuit, wherein the substrate of the planar lightwave circuit has an inclined surface at the light-emitting side end of the planar lightwave circuit.

13. The light source device according to claim 12, wherein the substrate is a silicon substrate and the inclined surface is a crystal plane.

14. The light source device according to claim 11, wherein at the light-emitting side end of the planar lightwave circuit, a portion of the waveguide has an inclined surface with respect to the propagating direction of light, a light-reflecting film is disposed on the inclined surface to form the light-reflecting surface, and a portion of the substrate of the planar lightwave circuit is not present in the predetermined range corresponding to a spread angle of light reflected at the light-reflecting surface.

15. The light source device according to claim 11, comprising a plurality of semiconductor laser elements each respectively configured to emit light in a red range, a blue range and a green range,
a plurality of cores each corresponding to respective one of the plurality of semiconductor laser elements;
wherein light emitted from the plurality of semiconductor laser elements is combined in the planar lightwave circuit.

16. A light source device comprising:
a sub-mount;
a semiconductor laser element disposed on a substrate, and a planar lightwave circuit (PLC) which is an optical member having a waveguide formed on the substrate, the semiconductor laser element being spaced apart from the waveguide of the planar lightwave circuit (PLC); wherein
the planar lightwave circuit is flip-chip mounted on an upper surface of the sub-mount,
the semiconductor laser element is secured on the sub-mount through the planar lightwave circuit and the substrate,
a light-emitting point of the semiconductor laser element and a core of the waveguide are substantially aligned,
a light-reflecting surface is provided such that light emitted from the semiconductor laser element and propagating along a propagating direction in the planar lightwave circuit is reflected at the light-reflecting surface in a direction substantially normal to the propagating direction, and
the substrate is not present at least in a predetermined range from an end of the planar lightwave circuit opposite to a light incident surface of the planar lightwave circuit.

17. The light source device according to claim 1, comprising an upward-reflecting mirror configured to serve as the light-reflecting surface and disposed at a light-emitting side of the planar lightwave circuit, the mirror being spaced apart from the planar lightwave circuit.

18. The light source device according to claim 1, wherein the substrate of the planar lightwave circuit has an inclined surface at the light-emitting side end of the planar lightwave circuit.

19. The light source device according to claim 18, comprising an upward-reflecting mirror configured to serve as the light-reflecting surface and disposed at a light-emitting side of the planar lightwave circuit, the mirror being spaced apart from the planar lightwave circuit.

20. The light source device according to claim 9, wherein the light-reflecting surface is provided at a light-emitting end of the planar lightwave circuit.

21. The light source device according to claim 16, wherein the light-reflecting surface is provided at a light-emitting end of the planar lightwave circuit.

22. The light source device according to claim 9, wherein an upward-reflecting mirror is spaced apart from the planar lightwave circuit.

23. The light source device according to claim 16, wherein an upward-reflecting mirror is spaced apart from the planar lightwave circuit.

\* \* \* \* \*